(12) United States Patent
Qin et al.

(10) Patent No.: US 7,737,010 B2
(45) Date of Patent: Jun. 15, 2010

(54) METHOD OF PHOTORESIST STRIP FOR PLASMA DOPING PROCESS OF SEMICONDUCTOR MANUFACTURING

(75) Inventors: Shu Qin, Boise, ID (US); Allen McTeer, Eagle, ID (US); Robert J. Hanson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 324 days.

(21) Appl. No.: 11/404,306

(22) Filed: Apr. 14, 2006

(65) Prior Publication Data
US 2007/0243700 A1    Oct. 18, 2007

(51) Int. Cl.
*H01L 21/26* (2006.01)
(52) U.S. Cl. .................. 438/513; 438/725; 438/689; 438/798; 257/E21.256
(58) Field of Classification Search ............... 438/513, 438/798, 514, 689, 725; 257/E21.252, E21.256
See application file for complete search history.

(56) References Cited

U.S. PATENT DOCUMENTS

| | | | | |
|---|---|---|---|---|
| 5,223,443 | A | * | 6/1993 | Chinn et al. ............. 438/14 |
| 5,672,541 | A | | 9/1997 | Booske et al. |
| 5,824,604 | A | * | 10/1998 | Bar-Gadda ............. 438/725 |
| 5,895,272 | A | * | 4/1999 | Li ............................ 438/705 |
| 6,207,583 | B1 | * | 3/2001 | Dunne et al. ........... 438/725 |
| 6,410,430 | B1 | | 6/2002 | Lee et al. |
| 6,627,588 | B1 | * | 9/2003 | Hess et al. .............. 510/176 |
| 6,936,518 | B2 | | 8/2005 | Hwang et al. |
| 7,410,909 | B2 | * | 8/2008 | Han et al. ............... 438/745 |
| 2002/0153099 | A1 | * | 10/2002 | Wang et al. ........... 156/345.24 |
| 2004/0043337 | A1 | * | 3/2004 | Chen et al. ............ 430/329 |
| 2004/0137397 | A1 | * | 7/2004 | Cox ....................... 432/253 |
| 2004/0214448 | A1 | * | 10/2004 | Chan et al. ........... 438/725 |
| 2005/0023274 | A1 | * | 2/2005 | Boyers .................. 219/628 |
| 2005/0112883 | A1 | * | 5/2005 | Savas et al. .......... 438/689 |
| 2005/0215050 | A1 | * | 9/2005 | Smith et al. .......... 438/622 |
| 2006/0228897 | A1 | * | 10/2006 | Timans ................. 438/758 |
| 2006/0281265 | A1 | * | 12/2006 | Burnham et al. ..... 438/287 |
| 2007/0051471 | A1 | * | 3/2007 | Kawaguchi et al. ... 156/345.36 |

FOREIGN PATENT DOCUMENTS

EP        942463 A   *  9/1999
FR    EP 0942463 A2  *  9/1999

* cited by examiner

*Primary Examiner*—W. David Coleman
*Assistant Examiner*—Latanya Crawford
(74) *Attorney, Agent, or Firm*—TraskBritt (57) ABSTRACT

A method of forming an intermediate semiconductor device is disclosed that comprises providing a semiconductor substrate, forming a photoresist layer on the semiconductor substrate, implanting a dopant into the semiconductor substrate, and removing a dopant-containing layer from the photoresist layer. The dopant-containing layer includes dopant residuals and a carbon-rich crust and may be formed during implantation. The dopant-containing layer may be removed from the photoresist layer by exposing the dopant-containing layer to a water rinse, a chlorinated plasma or to a fluorinated plasma. The water rinse may include deionized water that is maintained at a temperature that ranges from approximately 25° C. to approximately 80° C. The fluorinated plasma may be formed from a gaseous precursor selected from the group consisting of nitrogen trifluoride, carbon tetrafluoride, trifluoromethane, hexafluoroethane, sulfur hexafluoride, and mixtures thereof. A method of forming an ultrashallow junction is also disclosed.

15 Claims, 6 Drawing Sheets

METHOD OF PHOTORESIST STRIP FOR PLASMA DOPING PROCESS OF SEMICONDUCTOR MANUFACTURING

FIELD OF THE INVENTION

The present invention relates to a method of manufacturing an intermediate semiconductor device. More specifically, the present invention relates to a method of removing a photoresist layer from the intermediate semiconductor device, where the photoresist layer is covered by a dopant-containing layer. The dopant-containing layer is removed from the photoresist layer without affecting the photoresist layer or other exposed layers on the intermediate semiconductor device.

BACKGROUND OF THE INVENTION

To implant dopants in junctions of a semiconductor device, plasma doping ("PLAD") (also known as plasma immersion ion implantation ("PIII")) and beamline ion implantation have been used. Beamline ion implantation is a high energy implantation technique where ions penetrate deeply into a substrate, semiconductor wafer, or other workpiece. In contrast, PLAD has unique advantages including system simplicity, lower cost and higher throughput.

In PLAD, the substrate is implanted with a dopant, such as boron (p-type dopant), arsenic (n-type dopant), or phosphorus (n-type dopant). The substrate is placed on a conductive platen, which functions as a cathode. A gaseous precursor to the dopant is introduced into a chamber and a voltage pulse is applied between the conductive platen and an anode or the chamber walls. Voltage pulse or other sources such as RF or microwave generate plasma and form a plasma sheath at the surface of the substrate. The applied voltage causes ions in the plasma to cross the plasma sheath and to be implanted into the substrate. The depth of implantation is related to the voltage applied between the substrate and the anode. Ultrashallow junctions are achieved using a low implant energy, such as an energy that ranges from approximately 50 eV to approximately 10 keV with a dose greater than $1\ e15/cm^2$.

The dopant is implanted into desired locations on the substrate containing a photoresist layer, which has been developed and etched to form a desired pattern. The photoresist layer functions as a mask and prevents the dopant from penetrating portions of the substrate covered by the photoresist layer while the dopant penetrates the exposed portions of the substrate. However, during implantation, the dopant may deposit on the photoresist layer, forming a film on a surface thereof. During subsequent processing, the photoresist layer is difficult to remove from the substrate due to the presence of the dopant-containing layer and a carbon-rich crust on the photoresist layer. For instance, the photoresist layer is not effectively removed by a conventional post-implant strip and cleaning process, such as a plasma strip process that utilizes oxygen gas ("$O_2$") with a forming gas (approximately 4% hydrogen ("$H_2$") in nitrogen ("$N_2$")). This post-implant strip and cleaning process is conducted at a microwave power of approximately 2000 W, a temperature of approximately 300° C., and an exposure time of 50 seconds and is referred to herein as the "$O_2$ plasma strip." During the $O_2$ plasma strip, "popping" of the photoresist layer occurs, producing significant amounts of photoresist residuals that remain on the substrate and form the carbon-rich crust.

For instance, if the implanted dopant is boron, a boron-containing ("B-containing") layer may form on the substrate during implantation depending on process conditions. The B-containing layer is a film of a nonvolatile, boron, boron oxide ("$B_2O_3$") or a mixture thereof that covers the photoresist layer and prevents removal of the photoresist layer using the $O_2$ plasma strip. Although several alternatives have been developed to minimize or control the formation of the B-containing layer, the B-containing layer continues to be deposited on the photoresist layer under certain implantation conditions. Currently, the best alternative for removing the B-containing layer is to expose the substrate to a Piranha solution, an SC1 (RCA1) solution, a hydrogen fluoride solution, or mixtures thereof. Piranha is also known as "SPM" (Sulfuric Acid and Hydrogen Peroxide Mixture). The normal processing temperature is approximately 100-150° C. "SC1" is also known as "APM" or Ammonium Hydroxide and Hydrogen Peroxide Mixture. Hydrogen fluoride is typically provided in a ratio with deionized water of 100:1 to 500:1 However, these solutions cause streaking defects across the substrate, which leads to downstream processing problems.

PLAD and beamline ion implantation are commonly used to produce source/drain regions in complementary metal-oxide-semiconductor ("CMOS") transistors. However, one difficulty with CMOS processing is achieving increasingly shallow source/drain junctions while maintaining predictable and desired performance of the CMOS transistor. As the dimensions of CMOS transistors become smaller, it is becoming harder to form shallow junctions while maintaining or improving overall performance of the CMOS transistors. As the sizes of semiconductor devices decrease, low energy implant processes are needed to form features on the semiconductor device, such as CMOS transistors. For instance, to prevent current leakage in small-scale transistors, techniques for forming ultrashallow junctions having a depth of less than approximately 50 Å-500 Å, typically 200 Å from a top surface of the substrate and a high fraction of dopants in an unclustered state are needed. Due to the low energy and shallow implantation available with PLAD, PLAD is replacing beamline ion implantation in the formation of ultrashallow junctions. PLAD is also advantageous to beamline implantation due to its system simplicity, lower cost, and higher throughput. However, PLAD is a more complicated process than beamline implantation because of its plasma environment and non-mass-analyzed feature.

BRIEF SUMMARY OF THE INVENTION

The present invention relates to a method of forming an intermediate semiconductor device that includes providing a semiconductor substrate, forming a photoresist layer on the semiconductor substrate, implanting a dopant into the semiconductor substrate, and removing a dopant-containing layer from the photoresist layer. Implantation may occur, for example, by plasma immersion or plasma doping. The dopant may be selected from the group consisting of boron, arsenic, phosphorus, germanium, and silicon. During implantation, a dopant-containing layer that includes dopant residuals and a carbon-rich crust may be formed on the photoresist layer. The photoresist layer may subsequently be removed from the semiconductor substrate.

The dopant-containing layer may be removed from the photoresist layer by exposing the dopant-containing layer to a water rinse comprising deionized ("DI") water. The water rinse may be maintained at a temperature that ranges from approximately 25° C. to approximately 80° C. The dopant-containing layer may be exposed to the water rinse for a sufficient amount of time to solubilize the dopant-containing layer.

Alternatively, the dopant-containing layer may be removed from the photoresist layer by exposing the dopant-containing layer to a fluorinated or chlorinated plasma. The fluorinated plasma may be formed using a gaseous precursor selected from the group consisting of nitrogen trifluoride, carbon tetrafluoride, trifluoromethane, hexafluoroethane, sulfur hexafluoride, and mixtures thereof. The fluorinated plasma may also include $O_2$ and at least one of hydrogen in nitrogen (forming gas), hydrogen, nitrogen, ammonia, water vapor, helium, and argon. The dopant-containing layer may be removed from the photoresist layer by reacting fluorine species with dopant atoms to form volatile fluorinated by-products. The chlorinated plasma may be formed using a gaseous precursor selected from the group consisting of hydrochloric acid (HCl) and chlorine ($Cl_2$) and mixtures thereof. The chlorinated plasma may also include $O_2$ and at least one of hydrogen in nitrogen (forming gas), hydrogen, nitrogen, ammonia, water vapor, helium, and argon.

The present invention also relates to a method of forming an ultrashallow junction that comprises providing an intermediate semiconductor device comprising a semiconductor substrate and a photoresist layer formed on the semiconductor substrate. At least a portion of the semiconductor substrate is plasma doped through the photoresist layer. A dopant-containing layer is removed from the photoresist layer by exposing the dopant-containing layer to a water rinse or exposing the dopant-containing layer to a fluorinated plasma or a chlorinated plasma.

BRIEF DESCRIPTION OF THE SEVERAL VIEWS OF THE DRAWINGS

While the specification concludes with claims particularly pointing out and distinctly claiming that which is regarded as the present invention, the advantages of this invention may be more readily ascertained from the following description of the invention when read in conjunction with the accompanying drawings in which:

DETAILED DESCRIPTION OF THE INVENTION

A method of removing a photoresist layer from an intermediate semiconductor device is disclosed. The photoresist layer is removed after implanting the intermediate semiconductor device with a dopant by PLAD. The intermediate semiconductor device includes a semiconductor substrate, the photoresist layer formed on the semiconductor substrate, and a dopant-containing layer formed on the photoresist layer. As used herein, the term "semiconductor substrate" refers to a conventional silicon substrate or other bulk substrate having a layer of semiconductor material. As used herein, the term "bulk substrate" includes not only silicon wafers, but also silicon on insulator ("SOI") substrates, silicon on sapphire ("SOS") substrates, epitaxial layers of silicon on a base semiconductor foundation, and other semiconductor, optoelectronics, or biotechnology materials, such as silicon-germanium, germanium, gallium arsenide, or indium phosphide. For instance, the semiconductor substrate may be a <100> high purity, silicon wafer that is lightly doped with an n-type dopant. Such semiconductor substrates are known in the art and are fabricated in a well known manner.

The photoresist layer functions as a mask during the PLAD, protecting portions of the semiconductor substrate from ion implantation. The photoresist layer may include a carbon-based, photoresist material, such as a carbon-based, deep ultraviolet ("DUV") photoresist material or a carbon-based, extreme ultraviolet ("EUV") photoresist material. Other exemplary photoresists include G, H, and I line resists and commercial photoresists, for example, SEPR-402 (available from Shin-Etsu Chemical Co., Ltd., 6-1, Ohtemachi 2-chome, Chiyoda-ku, Tokyo 100-0004, Japan), OIR-620 (available from FUJIFILM Electronic Materials U.S.A., Inc., 80 Circuit Drive North Kingstown, R.I. 02852), M575Y and M642Y available from JSR Corporation, 1280 North Mathilda Ave., Sunnyvale, Calif. 94089.

The photoresist material may be applied to the semiconductor substrate by techniques known in the art, such as by spin-coating. The photoresist material may be exposed and developed, as known in the art, to form the photoresist layer having a desired pattern. The pattern is formed from portions of the photoresist layer that remain on the semiconductor substrate and portions of the photoresist layer that have been removed. The portions of the photoresist layer remaining on the semiconductor substrate may prevent the dopant from penetrating the semiconductor substrate at those locations, while the removed portions of the photoresist layer expose the surface of the underlying semiconductor substrate, enabling the dopant to be selectively implanted into the semiconductor substrate. The dopant may also be deposited on the portions of the photoresist layer remaining on the semiconductor substrate, forming the dopant-containing layer. As used herein, the term "dopant-containing layer" refers to a film or residuals of the dopant, a carbon-rich crust, or a film or residuals of the dopant and a carbon-rich crust. The dopant-containing layer is formed as a result of dopant implantation by PLAD.

Since the method described herein uses PLAD to dope the semiconductor substrate, the method may be useful to form and dope ultrashallow junctions in CMOS transistors. While the formation of ultrashallow junctions in CMOS transistors is described herein, the method may also be used in other situations where it is desirable to remove a dopant-containing layer. For instance, the method may be used in situations where the photoresist layer of the intermediate semiconductor device is contaminated with a dopant-containing layer, preventing effective removal of the photoresist layer.

Figure 1:
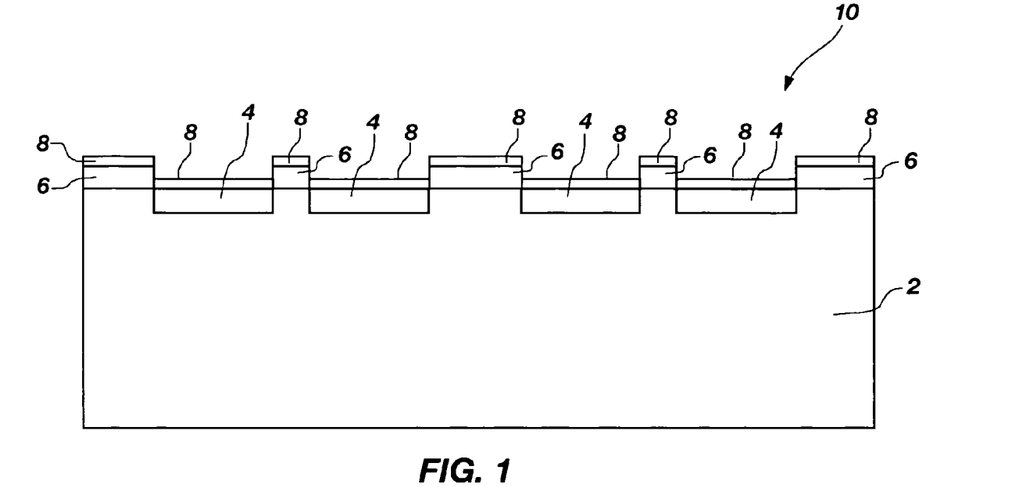
FIG. 1 is a schematic illustration of an intermediate semiconductor device according to the present invention.

As shown in FIG. 1, the semiconductor substrate 2 may be subjected to PLAD through the photoresist layer 6, forming doping regions 4, which correspond to ultrashallow junctions. The doping region 4 may be an $n^+$ type doping region 4 or a $p^+$ type doping region 4 depending on the dopant used in the PLAD. The dopant may be boron ("B"), arsenic ("As"), phosphorus ("P"), germanium ("Ge"), or silicon ("Si"). Dopant implantation by PLAD is known in the art and, therefore, is not discussed in detail herein. PLAD chambers or devices are also known in the art and, therefore, are not described in detail herein. For the sake of example only, the semiconductor substrate 2 may be implanted with boron by introducing a gaseous precursor, such as diborane ("$B_2H_6$") or boron trifluoride ("$BF_3$"), into a PLAD chamber. A plasma is generated from a mixed gas of dopant gases with nonreactive gas, such as argon, $N_2$, $H_2$, or helium, causing boron ions to penetrate a shallow depth into the semiconductor substrate 2. The ions have a low energy by applied bias, on the order of a maximum of several ten to thousand volts, and, therefore, is suitable for doping the semiconductor substrate at a shallow depth of approximately 10 nm-50 nm. If the dopant is arsenic, arsine ("$AsH_3$"), arsenic trifluoride ("$AsF_3$"), or arsenic pentafluoride ("$AsF_5$") may be used as the gaseous precursor. If phosphorus is the dopant, phosphine ("$PH_3$") may be used as the gaseous precursor. If silicon is the dopant, silane ("$SiH_4$") or silicon tetrafluoride ("$SiF_4$") may be used as the gaseous precursor. If germanium is the dopant, germanium tetrahydride ("$GeH_4$") or germanium tetrafluoride ("$GeF_4$") may be used as the gaseous precursor. The implant conditions (ratio of gaseous precursor to nonreactive gas, power, dose, pulse voltage, pulse width, frequency, temperature, pressure, exposure time, etc.) may be selected by a person of ordinary skill in the art based on the type of dopant to be implanted and the desired implantation depth. Therefore, these conditions are not described in detail herein. For the sake of example only, if the semiconductor substrate 2 is implanted with boron, the implant conditions may include 15% $B_2H_6$/85% $H_2$ implanted at −6 kV, 60 μsec/5 kHz pulse, an RF power of 725 W, and a pressure of 6 mTorr.

In addition to doping the ultrashallow junction, PLAD may also cause the dopant-containing layer 8 to form on the photoresist layer 6 as implantation proceeds. For instance, if the dopant is boron, a B-containing layer may form on the photoresist layer 6. As previously mentioned, the photoresist layer 6 may not be easily removed by the $O_2$ plasma strip because the photoresist layer 6 is covered by the dopant-containing layer 8. Therefore, in order to enable effective removal of the photoresist layer 6, the dopant-containing layer 8 may be removed. The dopant-containing layer 8 may be removed using a water rinse or a fluorinated plasma. One skilled in the art would also recognize may be used to remove the dopant-containing layer 8, for example, halide gases (i.e., chlorine or bromine) may be suitable. While removal of a B-containing layer is described herein, similar methods may be used to remove a dopant-containing layer 8 that includes arsenic, phosphorus, germanium, or silicon as the dopant.

In one embodiment, the dopant-containing layer 8 is removed from the photoresist layer 6 by exposing the intermediate semiconductor device 10 to the water rinse. The water rinse may include DI water maintained at a temperature that ranges from approximately room temperature (approximately 25° C.) to approximately 80° C. For instance, the water rinse may be maintained at a temperature that ranges from approximately 25° C. to approximately 65° C. The water rinse may be maintained at the desired temperature using a heated vessel, such as a water bath. The temperature of the water rinse may be adjusted depending on an amount of time the intermediate semiconductor device 10 is to be exposed to the water rinse. For instance, if a short exposure time is desired, the water rinse may be maintained at a high temperature. Conversely, if a long exposure time is desired, the water rinse may be maintained at a low temperature. The intermediate semiconductor device 10 may be exposed to the water rinse for an amount of time sufficient to remove the dopant-containing layer 8, such as from approximately 1 minute to approximately 30 minutes. However, shorter or longer exposure times may be used depending on the conditions used to implant the dopant, such as the ratio of gaseous precursor to nonreactive gas, power, dose, temperature, pressure, etc.

The dopant-containing layer 8 may be soluble at the temperature at which the water rinse is maintained. Since the water rinse solubilizes the dopant-containing layer 8, the dopant-containing layer 8 may be easily removed from the photoresist layer 6, enabling subsequent removal of the photoresist layer 6, as described below. The intermediate semiconductor device 10 may be sprayed, dipped, or immersed in the water rinse. In one embodiment, a batch of intermediate semiconductor devices 10 is immersed in a water bath containing the water rinse and maintained at a temperature of approximately 55° C. to approximately 65° C. The batch may include approximately fifty intermediate semiconductor devices 10 from which the dopant-containing layers 8 are to be removed. The water rinse may remove substantially all of the dopant-containing layer 8 from the photoresist layer 6.

Figure 2:
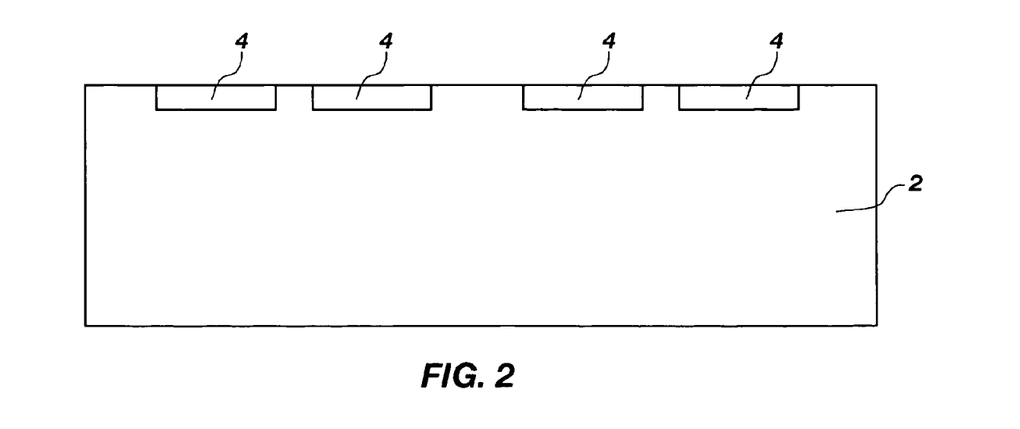
FIG. 2 is a schematic illustration of an intermediate semiconductor device wherein a photoresist layer and a dopant-containing layer are removed according to the present invention.

The intermediate semiconductor device 10, with the dopant-containing layer 8 removed, may then be exposed to a conventional strip process to remove the photoresist layer 6, as shown in FIG. 2. For the sake of example only, the conventional strip process may be the $O_2$ plasma strip previously described. When used in combination, the water rinse and the $O_2$ plasma strip may remove substantially all of the dopant-containing layer 8 and the photoresist layer 6 from the semiconductor substrate 2. As such, the combination of the water rinse and the $O_2$ plasma strip may provide an effective method of forming ultrashallow junctions on the semiconductor substrate 2. Since the water rinse includes no other ingredients, this method of removing the dopant-containing layer 8 is relatively simple and cost effective. In addition, the water rinse may remove the dopant-containing layer 8 without etching or otherwise damaging exposed layers (not shown) on the intermediate semiconductor device 10. As such, the dopant-containing layer 8 may be removed without affecting the performance of the intermediate semiconductor device 10 or any device that is ultimately produced from the intermediate semiconductor device 10.

For the sake of example only, the dopant-containing layer 8 is a B-containing layer that is removed by exposing the intermediate semiconductor device 10 to the water rinse. The B-containing layer is formed on the intermediate semiconductor device 10 during implantation of the semiconductor substrate 2 with boron. Boron implantation, such as by PLAD, is known in the art and, therefore, is not discussed in detail herein. For instance, boron implantation may be conducted by introducing the gaseous precursor, such as $B_2H_6$ or $BF_3$, into a PLAD chamber. PLAD causes boron ions to penetrate a shallow distance into the semiconductor substrate 2, forming the doping regions 4. In addition, the PLAD causes the boron atoms to be deposited on the photoresist layer 6, forming the B-containing layer. The intermediate semiconductor device 10 may be exposed to the water rinse to remove the B-containing layer and then to the $O_2$ plasma strip to remove the photoresist layer 6. After this treatment, the intermediate semiconductor device 10 may be substantially free of the B-containing layer and the photoresist layer 6.

In another embodiment, the dopant-containing layer 8 may be removed from the photoresist layer 6 by volatilizing the dopant residuals and the carbon-rich crust present on the photoresist layer 6. For instance, if the semiconductor substrate 2 has been doped with boron, boron residuals may be present on the photoresist layer 6. However, arsenic residuals, phosphorus residuals, germanium residuals, or silicon residuals may be present on the photoresist layer 6 if arsenic, phosphorus, germanium, or silicon, respectively, is used as the dopant. The dopant residuals and the carbon-rich crust may be formed on the photoresist layer 6 as a result of the PLAD, due to neutral and reactive species in the plasma. The chemical makeup and properties of the dopant residuals depend on the dopant and process conditions used. Similarly, the chemical makeup and properties of the carbon-rich crust depend on the photoresist material used and the processing conditions. For instance, if boron is implanted by PLAD using $B_2H_6/H_2$, the B-containing layer is deposited on a surface of the photoresist layer. Under typical process conditions, the B-containing layer has a thickness of up to approximately 200 Å. The carbon-rich crust includes carbonized material and may form due to "out-gassing" of the photoresist layer 6 during implantation, which is due to evaporation of solvent from the photoresist material.

The dopant residuals and the carbon-rich crust may be volatilized by exposing the intermediate semiconductor device 10 to a fluorinated plasma or a chlorinated plasma, which enables the dopant residuals and the carbon-rich crust to be removed from the photoresist layer 6. The fluorinated plasma may include a fluorine-based gas, such as $NF_3$, $CF_4$, trifluoromethane ("$CHF_3$"), hexafluoroethane ("$C_2F_6$"), sulfur hexafluoride ("$SF_6$"), or mixtures thereof. As known in the art, the fluorinated plasma may be produced by remote RF or microwave plasma source so that the fluorine-based gas dissociates into fluorine radicals. The fluorine-based gas may provide a source of free fluorine, such as the fluorine radicals, which react with the dopant atoms to form volatile fluorine species. The fluorinated plasma may also include $O_2$ and the forming gas. The ratio of $O_2$ to forming gas in the fluorinated plasma may be adjusted to achieve the desired removal of the dopant residuals and the carbon-rich crust without etching or damaging exposed material layers (not shown) on the intermediate semiconductor device 10. For instance, if the dopant is boron, fluorine radicals may react with boron atoms to form $BF_3$, which is volatile and is released from the photoresist layer 6. The volatile fluorine species may then be easily evacuated from the strip chamber. A chlorinated plasma produced from a chlorine-based gas may also be used, as long as the chlorinated plasma does not etch the exposed material layers (not shown) on the intermediate semiconductor device 10. The chlorinated plasma may include a chlorine-based gas, such as HCl, $Cl_2$, or mixtures thereof. As known in the art, the chlorinated plasma may be produced by remote RF or microwave plasma source so that the chlorine-based gas dissociates into chlorine radicals. The chlorine-based gas may provide a source of free chlorine, such as chlorine radicals, which react with the dopant atoms to form volatile chlorine species. The chlorinated plasma may also include $O_2$ and the forming gas. The ratio of $O_2$ to forming gas in the chlorinated plasma may be adjusted to achieve the desired removal of the dopant residuals and the carbon-rich crust without etching or damaging exposed material layers (not shown) on the intermediate semiconductor device 10. One skilled in the art will recognize that various chemical species other than deionized water and fluoride or chloride plasma may be used to remove the dopant layer. For example, halide gases such as chloride and bromide, or hydrogen gas, may also be suitable.

The dopant residuals and the carbon-rich crust may be removed from the photoresist layer 6 at a moderate temperature, such as a temperature of less than approximately 200° C., such as approximately 180° C. The temperature may be sufficient to form the volatile fluorine species without causing popping of the photoresist material. The temperature may then be increased for the remainder of the fluorinated plasma process to ensure that the dopant residuals and the carbon-rich crust are completely removed from the photoresist layer 6. While the fluorinated or chlorinated plasma removes the dopant residuals and the carbon-rich crust, the plasma may not substantially etch exposed layers (not shown) of the intermediate semiconductor device 10, such as thermal oxide layers, borophosphosilicate glass layers, nitride layers, or polysilicon layers.

After removing the dopant residuals and the carbon-rich crust, the photoresist layer 6 may be removed using a conventional post-implant strip and cleaning process, such as the $O_2$ plasma strip previously described ($O_2$ with approximately 4% $H_2$ in $N_2$ using a microwave power of approximately 2000 W, a temperature of approximately 300° C., and an exposure time of 50 seconds). The $O_2$ plasma strip may optionally include a small amount of a fluorine-based gas (known as a "fluorine trickle"), such as $NF_3$, to remove residual traces of the dopant. The fluorinated plasma may enable the dopant-containing layer 8 to be substantially removed from the photoresist layer 6, which in turn enables the photoresist layer 6 to be substantially removed from the intermediate semiconductor device 10 using the $O_2$ plasma strip. The dopant-containing layer 8 and the photoresist layer 6 may be substantially removed without contaminating the intermediate semiconductor device 10 or affecting performance of the intermediate semiconductor device 10 or any device that is ultimately formed.

In another embodiment, the dopant-containing layer 8 and the photoresist layer 6 may be removed using a single plasma chemistry. The plasma may be formed from a mixture of $O_2$ and the fluorine-based gas, such as $NF_3$, $CF_4$, $CHF_3$, $C_2F_6$, $SF_6$, or mixtures thereof. The ratio of the $O_2$ to the fluorine-based gas may be controlled so that the dopant-containing layer 8 and the photoresist layer 6 are removed by a single plasma and forming gas (nitrogen and hydrogen) or nitrogen. The intermediate semiconductor device 10 may be exposed to this plasma and the temperature adjusted so that the dopant-containing layer 8 and the photoresist layer 6 are removed. For instance, the temperature may be adjusted so that the dopant-containing layer 8 and the photoresist layer 6 are removed while causing minimal popping of the photoresist material.

In summary, the water rinse, chlorinated plasma or the fluorinated plasma may be used to remove the dopant-containing layer 8 from the photoresist layer 6, enabling subsequent removal of the photoresist layer 6, such as by a conventional post-implant strip and cleaning process. The water rinse may be easier and cheaper to perform than the fluorinated or chlorinated plasma because the components of the former are relatively inexpensive and do not require the purchase of additional equipment, such as equipment to generate the plasma. In addition, the water rinse may be used in a batch process, increasing the capacity and throughput of processing the intermediate semiconductor device 10. However, the fluorinated plasma may provide comparable or improved removal of the dopant-containing layer 8 compared to the water rinse. As such, the water rinse, chlorinated plasma or the fluorinated plasma may be used to effectively remove dopant-containing layers 8 formed during the fabrication of ultrashallow junctions in semiconductor devices.

After removing the dopant-containing layer 8 and the photoresist layer 6, the intermediate semiconductor device 10 may be subjected to rapid thermal annealing, as known in the art. Subsequent processing steps, also known in the art, may be performed to form a completed semiconductor device, such as a CMOS transistor. For instance, the intermediate semiconductor device 10 may be annealed at approximately 1000° C. for approximately 10 seconds. In addition to activating the dopant implanted in the semiconductor substrate 2, the rapid thermal annealing may repair damage to the semiconductor substrate 2 caused during PLAD.

Figure 3:
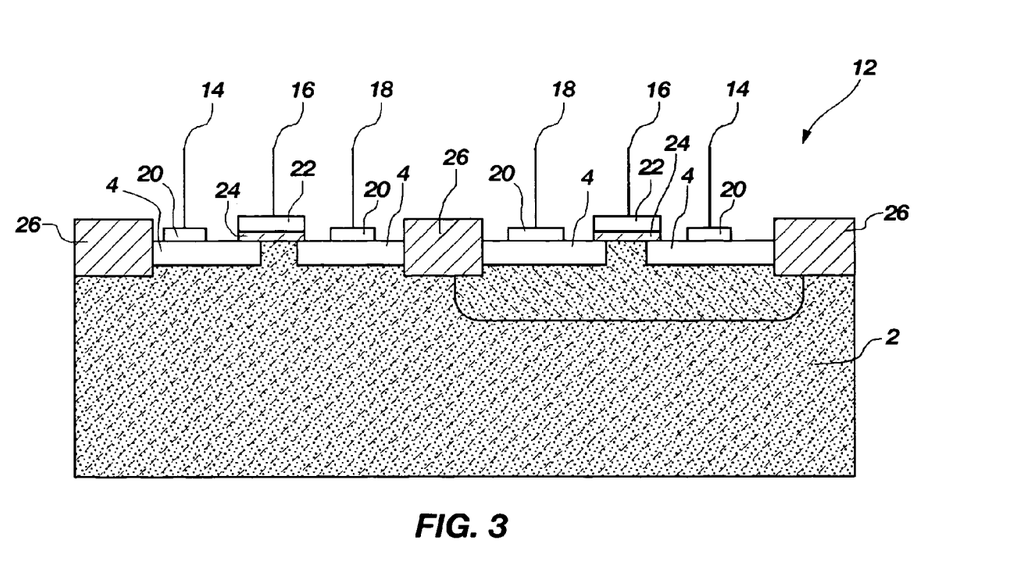
FIG. 3 is a schematic illustration of a CMOS transistor.

An exemplary embodiment of a CMOS transistor 12 formed from the intermediate semiconductor device 10 is shown in FIG. 3. The CMOS transistor 12 includes the doped semiconductor substrate 2 and source connections 14, gate connections 16, and drain connections 18 to p-type metal-oxide-semiconductor ("PMOS") and n-type metal-oxide-semiconductor ("NMOS") sides of the CMOS transistor 12. The CMOS transistor 12 also includes conductive connections 20 at the sources and drains, and a gate oxide layer 24 and polysilicon layer 22 at the gates. Additionally, thick isolation layers 26, such as of silicon dioxide, are placed between the PMOS and NMOS regions. These features of the CMOS transistor 12 may be fabricated using materials and techniques known in the art, which are not described in detail herein.

The following examples serve to explain embodiments of the present invention in more detail. These examples are not to be construed as being exhaustive or exclusive as to the scope of this invention.

EXAMPLES

Example 1

Water Rinse of Boron-Implanted Semiconductor Wafer

Figure 4:
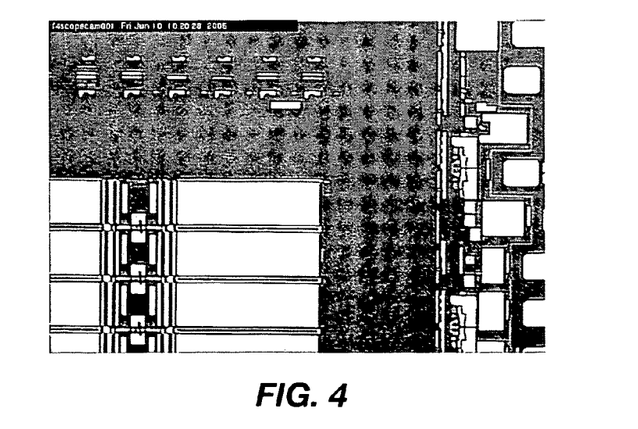
FIG. 4 shows an optical micrograph of a photoresist pattern on an intermediate semiconductor device implanted with boron.
Figure 5:
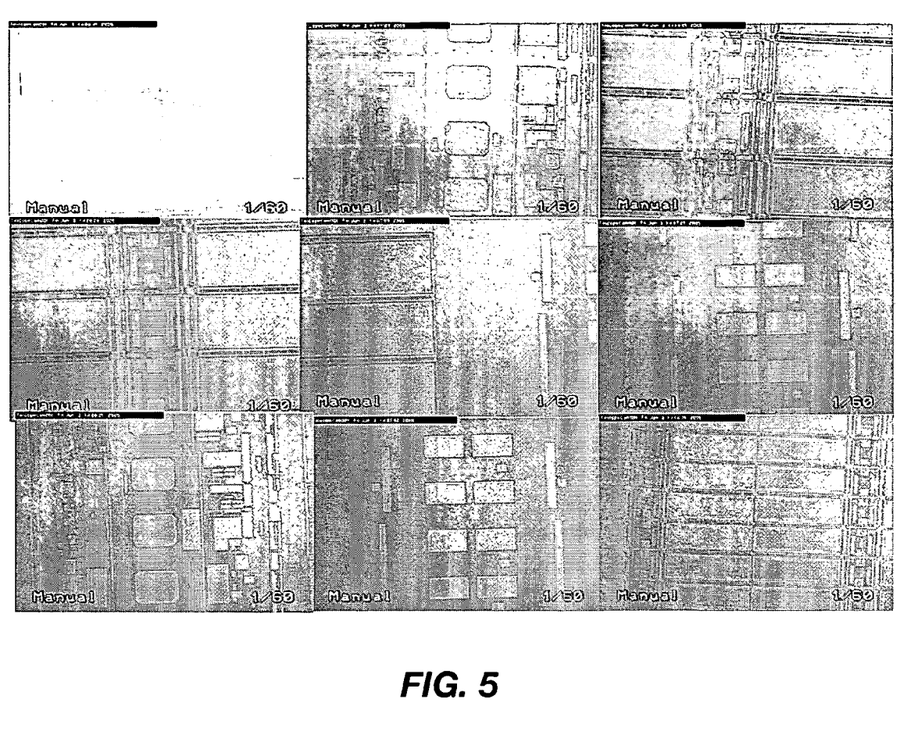
FIG. 5 shows scanning electron micrographs of various locations of the intermediate semiconductor device of FIG. 4 after wafer rinse and $O_2$ plasma strip.

A semiconductor wafer was implanted with boron by PLAD using 15% $B_2H_6$ and 85% $H_2$ at −6 kV, 60 μsec/5 kHz pulse, a dose of $2\times10^{16}/cm^2$ dose, an RF power of 725 W, and a pressure of 6 mTorr. The semiconductor wafer was implanted with the boron through a photoresist mask formed from a carbon-based photoresist material. Using SEPR-402, the photoresist pattern on the implanted semiconductor wafer is shown in FIG. 4. The implantation produced a boron-containing layer having approximately 70% boron and approximately 20% oxygen and a thickness of approximately 212 Å on the photoresist layer of the semiconductor wafer. The semiconductor wafer was exposed to a water rinse that included DI water maintained at a temperature that ranged from approximately 55° C. to approximately 65° C. The semiconductor wafer was exposed to the water rinse for approximately 5 minutes. The semiconductor wafer was then dried using conventional surface tension gradient drying technology and exposed to the conventional post-implant strip and cleaning process using $O_2$ and a forming gas (approximately 4% $H_2$ in $N_2$) with a microwave power of approximately 2000 W and a temperature of approximately 300° C. The semiconductor wafer was exposed to the conventional post-implant strip and cleaning process for approximately 50 seconds. As shown in FIG. 5, which illustrates various locations across the semiconductor wafer, no significant amount of the boron-containing layer or the boron residuals remained on the surface of the semiconductor wafer following the water rinse. In addition, the photoresist layer was completely removed from the semiconductor wafer.

Figure 6:
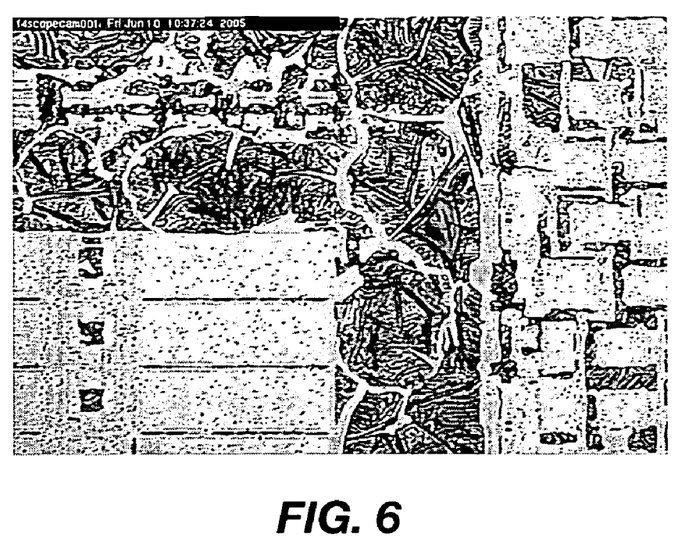
FIG. 6 shows an optical micrograph of the intermediate semiconductor device of FIG. 4 after being treated with the $O_2$ plasma strip for 50 seconds.
Figure 7:
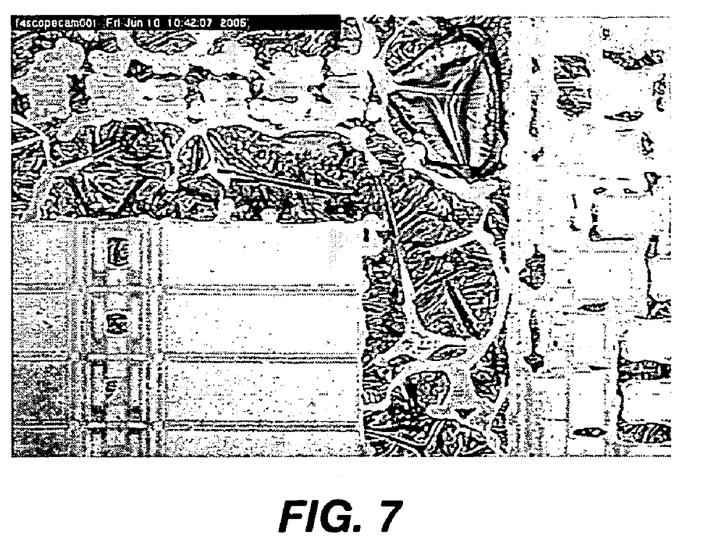
FIG. 7 shows an optical micrograph of the intermediate semiconductor device of FIG. 4 after being treated with the $O_2$ plasma strip for 120 seconds.

In contrast, a semiconductor wafer exposed to the same implant conditions followed by the conventional post-implant strip and cleaning process exhibited severe popping of the photoresist layer. In addition, significant amounts of photoresist residuals remained on the semiconductor wafer. The boron-containing layer and the boron residuals prevented complete removal of the photoresist layer, as shown in FIGS. 6 and 7. FIG. 6 shows the semiconductor wafer after exposure to the conventional post-implant strip and cleaning process for 50 seconds and FIG. 7 shows the semiconductor wafer after exposure to the conventional post-implant strip and cleaning process for 120 seconds.

Example 2

Fluorinated Plasma Treatment of Boron-Implanted Semiconductor Wafer

Figure 8:
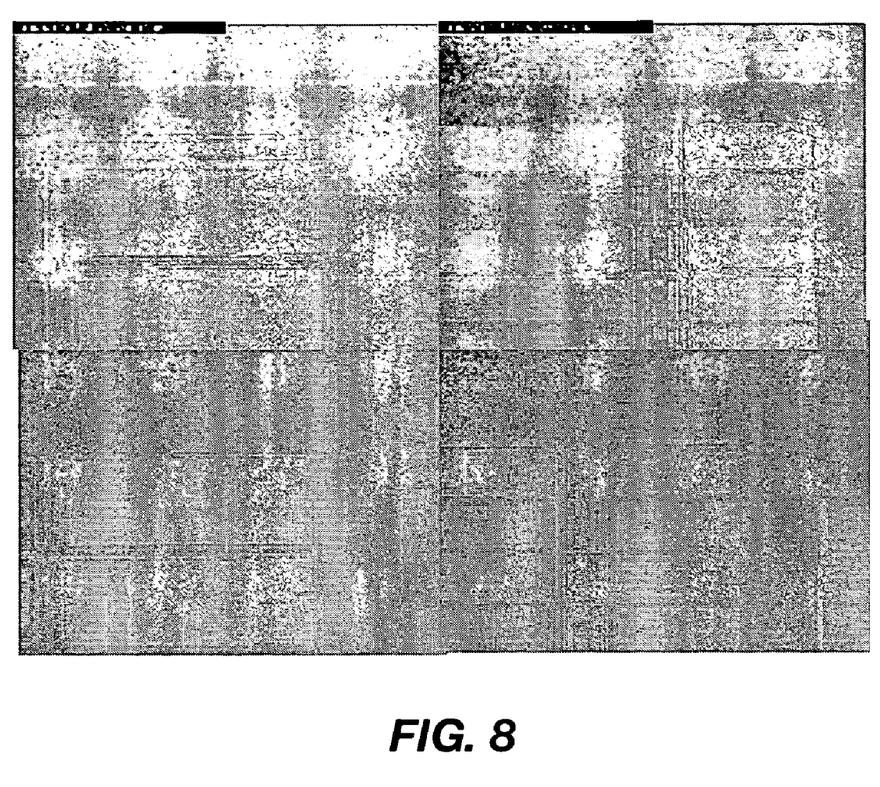
FIG. 8 shows optical micrographs of various locations of the intermediate semiconductor device of FIG. 4 after being treated with a fluorinated plasma that included carbon tetrafluoride ("$CF_4$")

A semiconductor wafer was implanted with boron by PLAD using 15% $B_2H_6$ and 85% $H_2$ at −6 kV, 60 μsec/5 kHz pulse, a dose of $2\times10^{16}/cm^2$, an RF power of 725 W, and a pressure of 6 mTorr. The semiconductor wafer was implanted with boron using a photoresist mask formed from a carbon-based (SEPR-402) photoresist material. The implantation produced a boron-containing layer having approximately 70% boron and approximately 20% oxygen and a thickness of approximately 212 Å on the photoresist layer of the semiconductor wafer. The semiconductor wafer was exposed to a $CF_4$ plasma that also included $O_2$ and a forming gas (3.6% $H_2$ in $N_2$). The $CF_4$ was present at approximately 70 standard cubic centimeters per minute ("sccm"), the $O_2$ was present at approximately 2000 sccm, and the forming gas was present at approximately 1500 sccm. The $CF_4$ plasma was generated at a power of approximately 1800 W, a temperature of approximately 180° C., and a pressure of approximately 1 Torr and exposed to the semiconductor wafer for approximately 35 seconds. The semiconductor wafer was then exposed to a mixture of $O_2$, the forming gas, and a trace amount of $NF_3$. The $O_2$ was present at approximately 2000 sccm, the forming gas was present at approximately 200 sccm, and the $NF_3$ was present at approximately 3 sccm. The semiconductor wafer was exposed to the $O_2$/forming gas/$NF_3$ mixture for approximately 8 seconds at a temperature of approximately 300° C. and a pressure of approximately 1 Torr. The semiconductor wafer was then exposed to a plasma of $O_2$/forming gas/$NF_3$. The $O_2$ was present at approximately 2000 sccm, the forming gas was present at approximately 200 sccm, and the $NF_3$ was present at approximately 3 sccm. The $O_2$/forming gas/$NF_3$ plasma was generated at a power of approximately 1800 W, a temperature of approximately 300° C., and a pressure of approximately 1 Torr and exposed to the semiconductor wafer for approximately 75 seconds. As shown in FIG. 8, this treatment completely removed the photoresist layer. The treatment did not negatively affect underlying layers of the semiconductor wafer, such as thermal oxide layers, borophosphosilicate glass layers, nitride layers, or polysilicon layers. However, several flakes formed in the semiconductor wafer and were visible at a 1× magnification. Without being bound to a particular theory, it is believed that the flaking was due to popping of the photoresist material.

Figure 9:
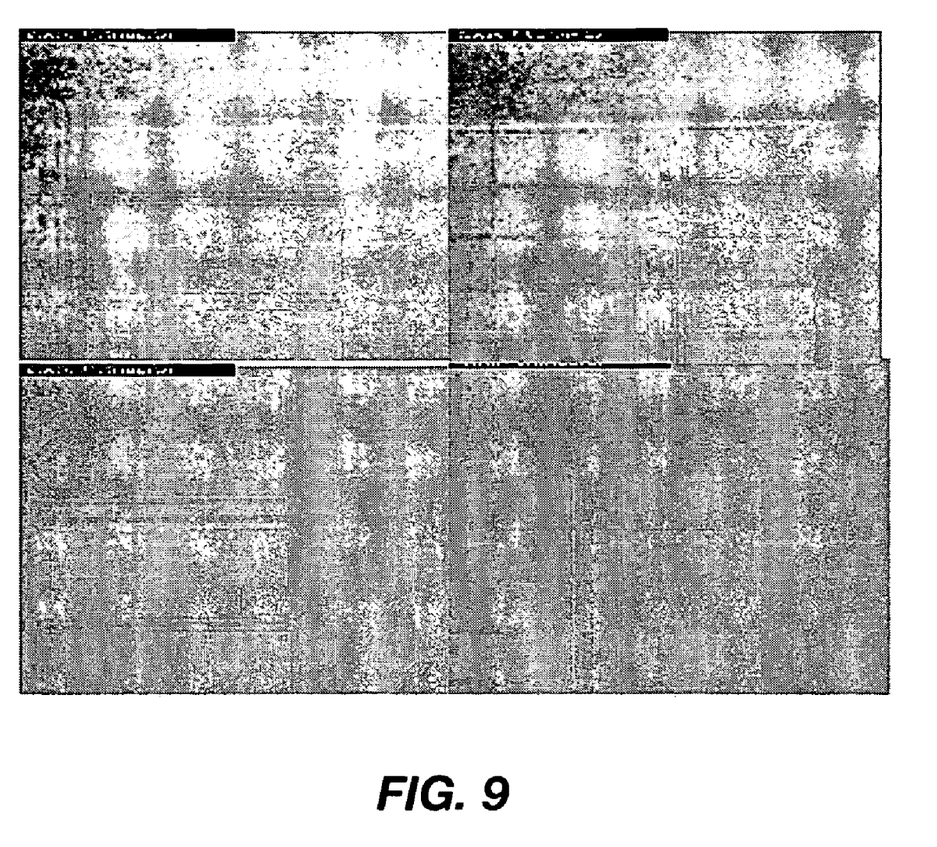
FIG. 9 shows optical micrographs of various locations of the intermediate semiconductor device of FIG. 4 after being treated with a fluorinated plasma that included nitrogen trifluoride ("$NF_3$").

A semiconductor wafer exposed to the same implantation conditions was also treated with a $NF_3$ plasma that also included $O_2$ and the forming gas. The $NF_3$ was present at 30 sccm, the $O_2$ was present at 2000 sccm, and the forming gas was present at 400 sccm. The $NF_3$ plasma was generated at a power of approximately 1800 W, a temperature of approximately 180° C., and a pressure of approximately 1 Torr and exposed to the semiconductor wafer for approximately 35 seconds. The semiconductor was then exposed to a mixture of $O_2$, the forming gas, and a trace amount of $NF_3$. The $O_2$ was present at approximately 2000 sccm, the forming gas was present at approximately 200 sccm, and the $NF_3$ was present at approximately 3 sccm. The semiconductor wafer was exposed to the $O_2$/forming gas/$NF_3$ mixture for approximately 8 seconds at a temperature of approximately 250° C. and a pressure of approximately 1 Torr. The semiconductor wafer was then exposed to a plasma of $O_2$/forming gas/$NF_3$. The $O_2$ was present at approximately 2000 sccm, the forming gas was present at approximately 200 sccm, and the $NF_3$ was present at approximately 3 sccm. The $O_2$/forming gas/$NF_3$ plasma was generated at a power of approximately 1800 W, a temperature of approximately 250° C., and a pressure of approximately 1 Torr and exposed to the semiconductor wafer for approximately 75 seconds. As shown in FIG. 9, this treatment completely removed the photoresist layer and did not produce visible flakes on the semiconductor wafer. The treatment did not negatively affect underlying layers of the semiconductor wafer, such as thermal oxide layers, borophosphosilicate glass layers, nitride layers, or polysilicon layers.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of forming an intermediate semiconductor device, comprising:
    forming a photoresist on a semiconductor substrate;
    implanting a dopant into the semiconductor substrate by plasma immersion or plasma doping to form a dopant-containing layer on the photoresist; and
    simultaneously introducing $O_2$ and a chlorine-based gas to remove the dopant-containing layer and the photoresist from the semiconductor substrate.

2. The method of claim 1, wherein forming the photoresist comprises spin-coating the photoresist over the semiconductor substrate.

3. The method of claim 1, wherein implanting the dopant comprises forming dopant residuals and a carbon-rich crust on the photoresist.

4. The method of claim 1, wherein implanting the dopant into the semiconductor substrate comprises implanting a dopant selected from the group consisting of boron, arsenic, phosphorus, germanium, and silicon.

5. The method of claim 1, wherein simultaneously introducing $O_2$ and the chlorine-based gas further comprises introducing hydrogen chloride or chlorine gas.

6. The method of claim 1, wherein introducing a chlorine-based gas further comprises reacting chlorine radicals with dopant atoms to form volatile chlorine species.

7. The method of claim 1, wherein simultaneously introducing $O_2$ and the chlorine-based gas comprises exposing a surface of the dopant-containing layer to a source that forms a volatile by-product with the dopant-containing layer.

8. The method of claim 3, wherein simultaneously introducing $O_2$ and the chlorine-based gas comprises volatilizing the dopant residuals and the carbon-rich crust on the photoresist.

9. The method of claim 1, further comprising removing the photoresist after exposing the dopant-containing layer to the chlorinated plasma to remove the dopant-containing layer from the photoresist.

10. The method of claim 5, further comprising at least one of a forming gas and nitrogen.

11. A method of forming an ultrashallow junction in an intermediate semiconductor device, comprising:
    plasma doping at least a portion of a semiconductor substrate through a photoresist formed thereon to form a dopant-containing layer on the photoresist;
    exposing the dopant-containing layer on the photoresist to a solution consisting essentially of a water rinse to remove the dopant-containing layer from the photoresist; and
    subsequently removing the photoresist.

12. The method of claim 11, wherein exposing the dopant-containing layer on the photoresist to the solution consisting essentially of a water rinse comprises exposing the dopant-containing layer to deionized water.

13. The method of claim 11, wherein exposing the dopant-containing layer on the photoresist to the solution consisting essentially of a water rinse comprises exposing the dopant-containing layer to deionized water maintained at a temperature that ranges from approximately 25° C. to approximately 80° C.

14. The method of claim 11, wherein exposing the dopant-containing layer on the photoresist to a solution consisting essentially of a water rinse comprises exposing the dopant-containing layer to deionized water for an amount of time sufficient to solubilize the dopant-containing layer.

15. The method of claim 11, wherein exposing the dopant-containing layer on the photoresist to the solution consisting essentially of a water rinse comprises exposing the dopant-containing layer to deionized water for an amount of time that ranges from approximately 1 minute to approximately 30 minutes.

* * * * *